Figure 1:
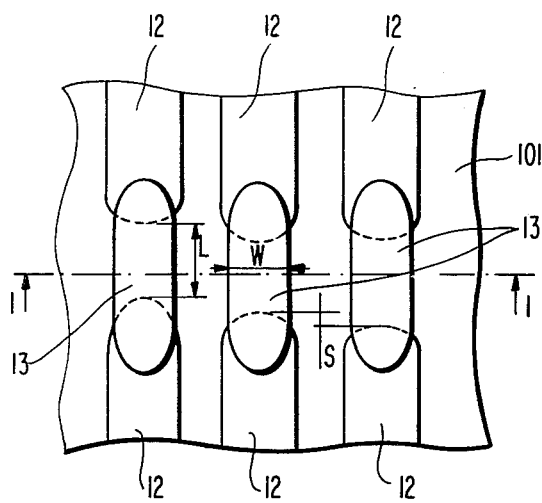
Figure 1:
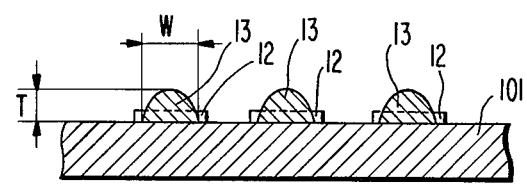

United States Patent [19]

Ohkubo et al.

[11] 4,204,107
[45] May 20, 1980

[54] THICK-FILM THERMAL PRINTING HEAD AND METHOD OF MANUFACTURING THE SAME

[75] Inventors: Toshio Ohkubo; Yuji Kajiwara; Tsutomu Itano, all of Tokyo, Japan

[73] Assignee: Nippon Electric Co., Ltd., Tokyo, Japan

[21] Appl. No.: 911,258

[22] Filed: May 31, 1978

[30] Foreign Application Priority Data

May 31, 1977 [JP] Japan ................................ 52/64313

[51] Int. Cl.² .............................................. H05B 1/00
[52] U.S. Cl. .................................... 219/216; 219/543; 338/307; 346/76 PH
[58] Field of Search ................................ 338/306–309; 219/216, 543, 243, 553; 346/76 PH

[56] References Cited

U.S. PATENT DOCUMENTS 3,984,844  10/1976  Tanno et al. ........................ 219/216
4,136,274  1/1979  Shibata et al. ........................ 219/216

Primary Examiner—C. L. Albritton
Attorney, Agent, or Firm—Sughrue, Rothwell, Mion, Zinn and Macpeak

[57] ABSTRACT

A thermal printing head which effects printing on thermally sensitive paper with Joule's heat generated by passing a current through a thick-film resistor is featured by the surface configuration of the thick-film resistor. In a cross-section perpendicular to the direction of the current passing through the resistor, the resistor is formed in such shape that the center portion is lower than the opposite edge portions. Owing to such concave top surface, despite of the fact that the heating resistor is a thick-film resistor, printing of high quality that is compatible to printing quality by a thin-film resistor can be accomplished. A practically useful thermal head having the resistors with the concave top surface can be realized through the photo-resist pattern technique combined with the screen printing technique.

5 Claims, 17 Drawing Figures

THICK-FILM THERMAL PRINTING HEAD AND METHOD OF MANUFACTURING THE SAME

The present invention relates to a thick-film thermal printing head, and more particularly, to a novel structure of heat-generating resistors in a thick-film thermal printing head that is suitable for facsimile recording and a method for manufacturing the same.

Thermal printing heads comprise resistive members coated with a protective layer, and conductive members to pass electrical current through the resistive members, both being secured on an insulative substrate. In operation, a recording signal current is passed through the selected resistive members and recording is effected by applying Joule's heat then generated to the thermally sensitive paper.

Heretofore, such thermal printing heads have been known as generally grouped into the thin-film resistor type, the semiconductor resistor type and the thick-film resistor type depending upon the materials of the heat-generating resistors and the method for manufacture. However, each type of thermal printed heads has been advantageous in one aspect but disadvantageous in another aspect with respect to the performance as well as the method for manufacturing.

The thermal printing heads of the thin-film resistor type and the semiconductor resistor type have satisfactory performance with respect to the characteristics of the heat-generating resistors such as precision in fluctuation of a resistance among a plurality of heat-generating resistors and reproducibility of dot shapes of heat-generating resistors. However, because the manufacturing method for them is principally based on the techniques of vapor deposition, sputtering, plating and photo-etching, large-scaled manufacturing equipment is needed, and thus the labor necessary for manufacture is increased and thereby manufacturing cost is high.

On the other hand, in the case of the thermal printing head of the thick-film resistor type, any pattern of the thick-film members can be easily formed by printing conductive paste, resistive paste, glass paste, etc., with screen plates having desired patterns, and thereafter all that is required is to carry out firing. Therefore, this type of thermal printing head has an inherent advantage that they can be manufactured at low cost employing simple equipment and a simple method in comparison to the aforementioned two types of thermal printing heads.

However, in case where a great number of fine resistive members are disposed in a lateral row as is the case with a thermal printing head to be used for facsimile recording, prior thick-film thermal printing heads have had the disadvantages that realization of high density arrangement of, for example, 6 dots/mm or higher was difficult and the gap clearance between adjacent heat-generating resistors could not be made narrow. Furthermore, the precision in fluctuation of the resistance among a plurality of resistive members was poor. All of these disadvantages are caused by the use of the screen printing technique.

As a more serious disadvantage, the resistive members cannot generate heat with uniform temperature distribution over their entire area, the temperature being lowered from the center towards the periphery, and so the printed image of the dot is smaller than the area of the heated resistive member, resulting in degraded recording quality. In order to avoid this disadvantage, the driving power is enhanced to bring the peripheral portion also up to printing temperature; then, however, the resistive members have a short life because their central portion is driven at an excessively high temperature, so that there remains a problem with respect to reliability. The aforementioned tendency is not restricted to the thick-film resistor type, but the same phenomena also occur in the case of the thin-film resistor type and the semiconductor resistor type, but they are especially remarkable in the case of the thick-film resistor type. The reason is believed to be that the above phenomena are essentially caused by thermal effects between the material of the resistive members and the material of the insulative substrate, and in the case of the thick-film resistor type the cross-section configuration of the resistive member serves as the biggest contributor to the cause.

More particularly, the transversal cross-section of a normally printed thick-film resistive member typically has a semicircular shape, so that most of the current flows through the central portion where the resistance is lowest and naturally the Joule's heat also takes the highest value at the central portion and is reduced towards the peripheral portions.

On the other hand, U.S. Pat. No. 3,903,393 issued Sept. 2, 1975 discloses a structure of a thermal printing head of the thick-film resistor type characterized in that the surfaces of the resistive members are made flat. According to this prior art, printing is made with resistive paste in a continuous bar shape across a plurality of conductive members, and thereafter discrete resistive members are formed by laser cutting. However, because of use of the laser beam, it is inevitable that the respective resistive members have fluctuation in resistance values due to unevenness of the cutting portions, and it is difficult to select spacing between the discrete resistive members at about 50 microns or less. In addition, there is the disadvantage that the resistive members are changed in quality by the heat of the laser beam and thereby uniform thermal printing was hardly effected.

Therefore, one object of the present invention is to provide a novel structure of thick-film resistor which can effect high-quality thermal printing with low power consumption and a method for manufacturing the same.

Another object of the prsent invention is to provide a thermal printing head of the thick-film resistor type, which can present a printing performance comparable to that of a thermal printing head of thin-film resistor type without degrading the low-cost nature of the thick-film thermal printing head, and a method for manufacturing the same.

According to one feature of the present invention, there is provided a thermal printing head of the thick-film type having the feature that each resistive member disposed between a pair of conductive members has such a shape that in a cross-section thereof perpendicular to the direction of a current passing therethrough the center portion is lower than the opposite edge portions.

According to another feature of the present invention, the above-featured thermal printing head is manufactured through a method comprising the steps of printing thick-film conductive members on a substrate, forming a photo-resist pattern having apertures at the locations where the resistive members are to be formed on the conductive members, applying a resistive paste layer on said photo-resist pattern by printing, firing or sintering the resistive paste layer, and simultaneously evaporating the photo-resist pattern.

Figure 2:
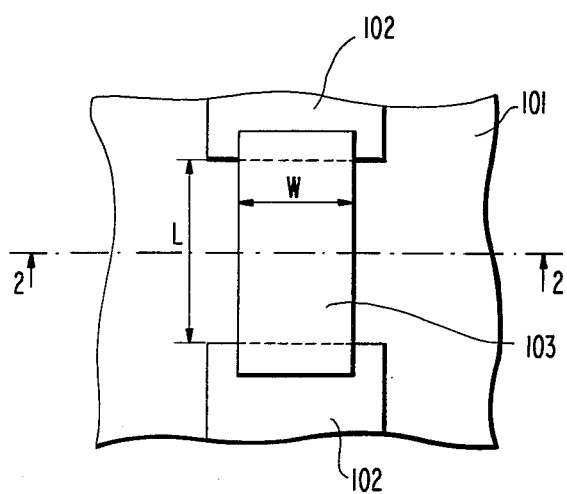
Figure 2:
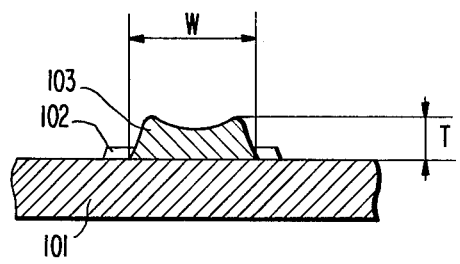
Figure 5:
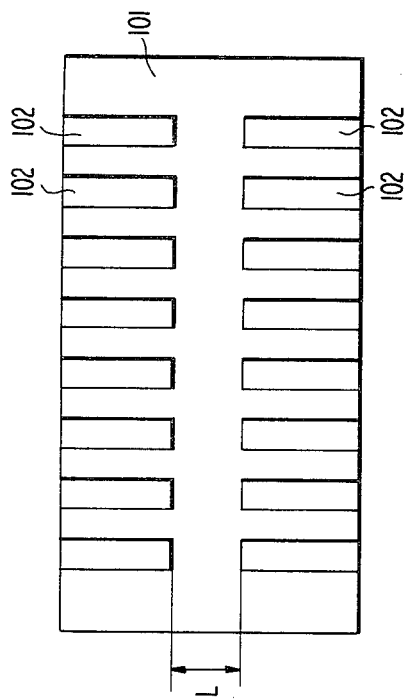
Figure 6A:
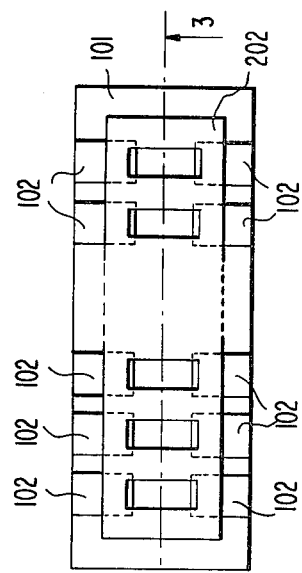
Figure 6B:
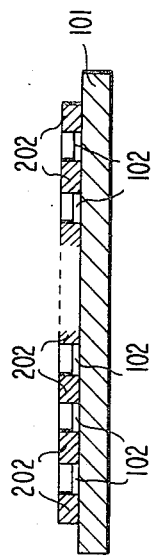
Figure 3:
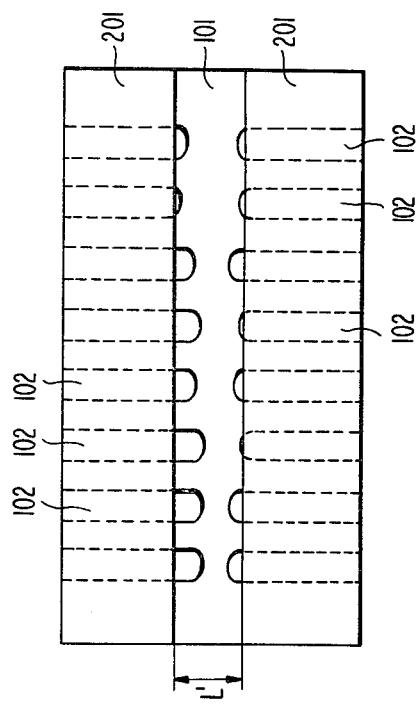
Figure 4:
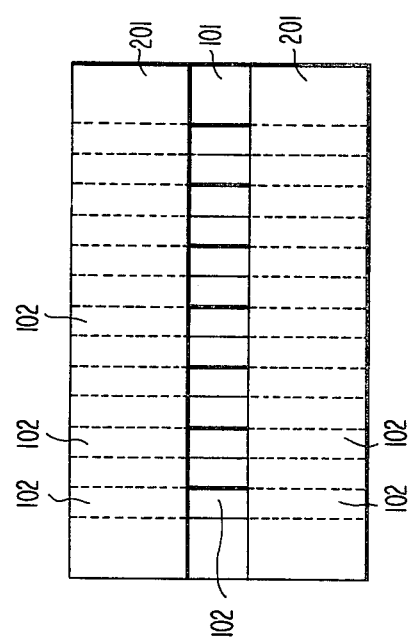
Figure 7A:
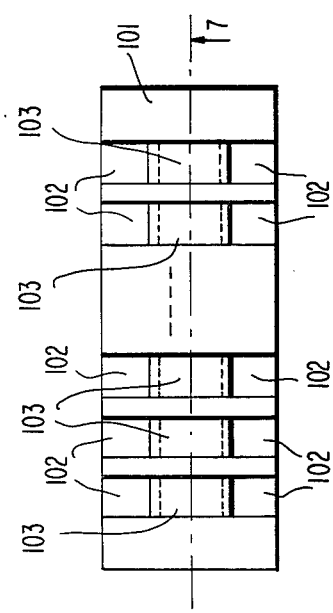
Figure 9A:
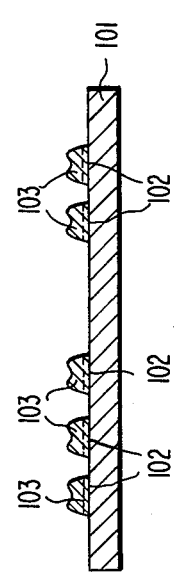
Figure 7B:
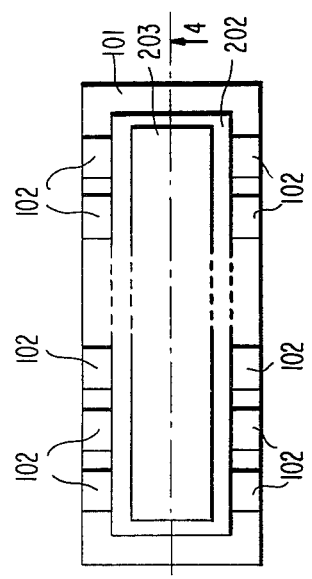
Figure 9B:
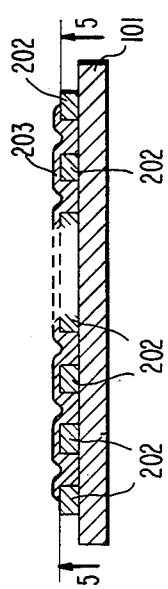
Figure 8A:
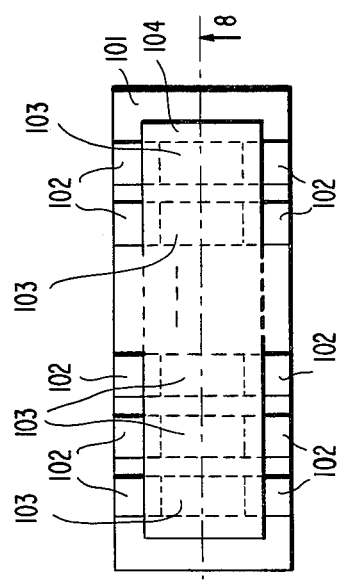
Figure 10A:
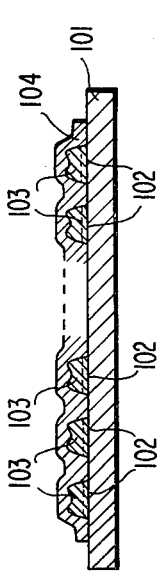
Figure 8B:
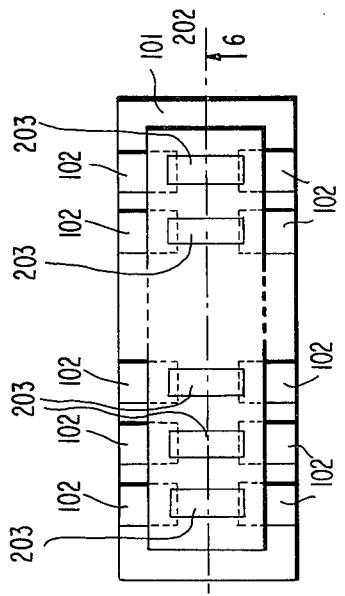
Figure 10B:
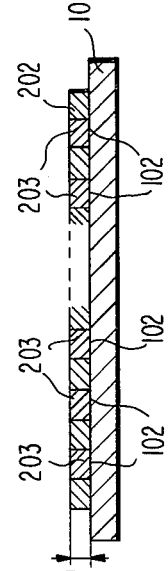

The above-mentioned and other features and objects of this invention will become more apparent by reference to the following description taken in conjunction with the accompanying drawings, in which:

FIG. 1A is a part plan view schematically showing a heat-generating resistor section in a thick-film resistor type thermal printing head in the prior art, FIG. 1B is a cross-sectional view taken along line 1—1 of FIG. 1A, FIG. 2A is a part plan view schematically showing a part of a heat-generating resistor section in a thick-film resistor type thermal printing head according to the prsent invention, FIG. 2B is a cross-sectional view taken along line 2—2 of FIG. 2A, FIG. 3 is a plan view to be used for explaining the process of producing thick-film lead electrodes in a thermal printing head accoring to one preferred embodiment of the present invention, FIG. 4 is a plan view to be used for explaining the process of producing thick-film lead electrodes in a thermal printing head accoring to another preferred embodiment of the present invention, FIG. 5 is a plan view showing thick-film lead electrodes in a thermal printing head according to one preferred embodiment of the present invention, FIG. 6A is a plan view of a photo-resist pattern as formed on thick-film lead electrodes for producing a heat-generating resistor section in a thermal printing head according to one preferred embodiment of the present invention, FIG. 6B is a cross-sectional view taken along line 3—3 of FIG. 6A, FIG. 7A is a plan view showing the state where resistive paste has been applied onto the photo-resist pattern by printing, FIG. 7B is a cross-sectional view taken along line 4—4 of FIG. 7A, FIG. 8A is a plan view showing the state where the excess resistive paste shown in FIG. 7B has been removed along line 5—5, FIG. 8B is a cross-sectional view taken along line 6—6 of FIG. 8A, FIG. 9A is a plan view showing the state where the photo-resist layer shown in FIG. 8A has been burnt and evaporated, FIG. 9B is a cross-sectional view taken along line 7—7 of FIG. 9A, FIG. 10A is a plan view showing the state where an anti-abrasion layer has been formed on the thermal printing head shown in FIG. 9A, and FIG. 10B is a cross-sectional view taken along line 8—8 of FIG. 10A.

Referring to FIGS. 1A and 1B, a thick-film resistor type thermal printing head in the prior art is illustrated which comprises a dielectric substrate 101 made of ceramics or the like, a plurality of columns of thick-film conductive members 12 and resistive members 13. The conductive members 12 are screen-printed with gold conductive paste onto a surface of the substrate 101. Thereafter, drying and firing process is proceeded to fix the paste as conductive members. In the same manner, the resistive members 12 are screen-printed with resistive paste so that it fills the spaces between the inner ends of conductive members 12 and is subjected to drying and firing process. As shown in FIG. 1B, each transversal section of normally printed thick-film resistive members 13 is semicircular. It is presumed that such semicircular shape is necessarily caused by the viscosity and surface tension of the printing paste upon screen printing or by the operation mechanism of peeling off of the screen-printing plate, and in the case of a fine pattern of resistive members 13, it is almost inevitable to form the semi-cylindrical configuration. In practice, though not shown in FIGS. 1A and 1B, an anti-abrasion thick-film dielectric layer is formed on resistive member 13.

Each resistive value of resistive members 13 is determined by the specific resistance of the material, width W, thickness T and length L (that is, the distance L between the inner ends of conductive members 12 in FIG. 1A) of resistive members 13; fluctuation of the resistance value arises in accordance with the fluctuations of these factors and normally amounts to about ±30% or higher. Accordingly, in order to obtain a practically useful thick-film resistor type thermal printing head, it is necessary to improve the precision of these dimensions. However, it is considerably difficult, in essence, to make the end pattern of the conductive members 12 produced by a screen printing technique uniform. More specifically, a screen printing plate is provided by forming a desired emulsion pattern made of a thin film of resin or metal on a fine mesh surface made of fine wires of resin or metal, and especially at an end portion of the pattern it is impossible to register perfectly the emulation end with the mesh wire, so that the openings of the mesh do not align straight at the emulsion end portion but present a zig-zag edge line. Consequently, the electrode pattern and the resistor pattern printed by means of such a screen printing plate also present similar configurations. Accordingly, in the thick-film resistor approach in the prior art which relies upon the screen printing technique, the dimensions of resistive members 13 and contuctive members 12 are compelled to take fairly large values.

In addition, from the same reasons the deviations in position of the conductive members 12 shown in FIG. 1A have fluctuations of about the same magnitude. It is quite natural that these fluctuations will become relatively larger as the thermal printing head is improved to higher resolution and the pattern becomes finer and denser.

Now the configuration of the thermal printing head according to the present invention will be described with reference to FIGS. 2A and 2B. In these figures, too, an anti-abrasion layer is omitted from the illustration as in FIGS. 1A and 1B. Comparing FIGS. 2A and 2B with FIGS. 1A and 1B, the characteristic feature of the resistive members in the thermal printing head according to the present invention will become apparent. That is, the transversal configuration of a resistive member 103 according to the present invention is of such shape that its edge portions are raised with respect to its center portion. Therefore, when a signal voltage is applied between opposed conductive members 102, current flows more easily through the edge portions of the resistive member 103, because if the resistive member is deemed as a distributed constant circuit, the thicker edge portion has a lower resistance value than the thinner center portion, and as a result, the Joule's heat becomes larger at the edge portions, so that the temperature distribution is made uniform over the entire heat-generating resistor and printing can be effected in a shape similar to the outer shape of the resistive members. Consequently, as it is not necessary to drive the thermal printing head at an excessive temperature by applying an excessively high driving voltage as is the case with the conventional thick-film thermal printing heads, there is the advantage that the life of the resistive members 103 is prolonged, the resistor becomes highly reliable, and as a whole low power consumption can be realized. In addition, as fully described later in connection with the method for manufacturing the thermal printing head of the present invention, the length L and width W of the resistive members 103 are determined by a photo-resist pattern, which is used in a process for forming a thick-film integrated circuit, so that they can be determined in a very precise manner, and in addition, since the thickness T of the resistor 103 is also determined almost depending upon the thickness of the photo-resist pattern, the thickness can be likewise determined at a high precision.

Now description will be made of a practical example of the method for manufacturing a thermal printing head according to the present invention.

As shown in FIG. 3, conductive members 102 are screen printed with conductive paste principally containing noble metal such as gold onto a surface of dielectric substrate 101 made of alumina or the like. The substrate and paste are fired in an oven at the proper temperature to fix the paste as conductive members. In order to select the length of the resistor, i.e., the distance between the inner ends of the opposed conductive members 102 as shown at L, a photo-resist film 201 having a gap of predetermined gap distance L', which is slightly shorter than L, is formed on the substrate 101 and conductive members 102. As the photo-resist material, the well-known AZ-340, AZ-1350, KPR, Laminer-A, etc. (trade names) materials which have been commonly used in the manufacture of thin-film integrated circuits, can be employed. It is to be noted that in order to facilitate formation of such a photo-resist pattern, it is desirable to use black dielectrics having a low reflective index for an exposure light such as black alumina ceramic for dielectric substrate 101.

After the aforementioned first step of the process, exposed portion of the conductive members 102 are removed through etching either by immersing the device in a noble metal etching liquid such as a conventional strong acid solution, such as aqua regia or potasium iodide solution or by blowing the etching liquid onto the device. When the photo-resist 201 is removed, the fine pattern of the thick-film conductive members 102 having constant spaces L are attained as shown in FIG. 5. Since the dimensions due to photo-etching can be controlled at a very high precision, normally within a tolerance of several microns, fluctuations for the normal spaces of about 200 microns between opposed ends of the conductive members can be suppressed within a few percent. Because fritless Au-paste or Au-paste containing a minute amount of frit is normally used for the conductive members 102 in a thermal printing head, the photo-etching can be easily effected even if the conductive paste is perfectly fired in the first step of the process. However, in some cases, the firing in the first step of the process could be limited to such extent that organic binder may be fired away and perfect firing could be effected after the etching in the second step of the process.

It is well known that the gap distance L' of the photo-resist 201 is selected somewhat shorter than the desired distance L so that the spaces between the ends of the conductive members 102 may eventually take the distance L after having been subjected to side-etching.

Alternatively, the first step of the process as described above with reference to FIG. 3 could be modified in such manner that conductive paste for the conductive members 102 are screen printed in a continued pattern without providing the gap where the resistive members are formed later as shown in FIG. 4 and the aforementioned spaces L are formed in the second step of the process as shown in FIG. 5. This modified embodiment, has the advantage that the preparation of the screen printing plate is very simple.

Subsequently, as shown in FIGS. 6A and 6B, on the surface of the insulator substrate 101 having the conductive members 102 which have been shaped in the preceding step, is formed a photo-resist film having a uniform thickness of 20-30 microns, then exposure through a photo-mask and development are effected so that apertures may be formed at the portions where heat-generating resistors are to be provided, and thereby a photo-resist pattern 202 is formed. For this photo-resist, the same material as that used in the first step can be employed.

Here it is to be noted that in order to assure the formation of the photo-resist pattern 202, the surface of the substrate 101 should be preferably black so that its reflection index for the exposure light may have a low value as described previously.

Next, as shown in FIGS. 7A and 7B, a well-known thick-film resistive paste of ruthenium oxide ($RuO_2$) series and the like is applied roughly onto the photo-resist pattern up to a desired thickness through the screen printing technique so that all the surface of the apertured portion of the photo-resist pattern 202 prepared in the third step of the process may be covered by the resistive paste 203, and after leveling and drying operations, a resistive layer 203 can be formed. Subsequently, in the fifth step of the process as shown in FIGS. 8A and 8B, top surface of the resistive layer 203 is removed either by grinding with a rotary grinder or by scraping with an appropriate jig such as a spatula, so that the resistive paste 203 may be left only in the apertures isolated from each other. Since the resistive paste 203 has not yet been fired perfectly, it can be easily ground or scraped.

In the sixth step of the process according to the present invention as shown in FIGS. 9A and 9B, both the resistive paste 203 obtained in the fifth step of the process and the photo-resist layer 202 are disposed in an electric furnace having an oxidizing atmosphere and subjected to firing at a predetermined high temperature (about 800°-900° C.), and thereby the photo-resist layer 202 is burnt and evaporated away, resulting in a discrete resistive members 103. At this moment, the resistive member 103 takes a cross-section configuration having somewhat raised edge portions with respect to a center portion as shown in FIG. 9B or in the previously noted FIG. 2B due to the burning of the photo-resist layer 202 and the surface tension of the thick-film resistive paste. In other words, each resistive member 103 has a concave top surface. In one example of the detailed configuration, the height of the center portion is 14–15 microns, the height at the opposite edge portions is 16–17 microns and the width W is 120 microns. The distance between the adjacent resistors can be selected at about 46 microns.

In thermal recording, since the thermally sensitive paper travels along the upper surfaces of the resistive members 103 in press contact thereto, the resistive members 103 will undergo abrasive action of the thermally sensitive paper, and if no provision is made, the resistive members 103 will wear and thus have a short life. In order to avoid this shortcoming, in the seventh step of the process as illustrated in FIGS. 10A and 10B, an anti-abrasion layer 104 is formed across the resistive members 103 and a part of conductive members 102. The anti-abrasion layer 104 can be formed, for instance, by printing with low melting point glass such as borate-silicate series glass through a screen printing process and then firing the same.

As will be seen from the above description, the length of the resistive members 103 is determined mainly by the gap distance of the photo-resist 201 used in the first step of the process, the width of the resistors is determined mainly by the width of the apertures in the photo-resist 202 used in the third step of the process, and the thickness of the resistors is determined mainly by the thickness of the photo-resist 202 used in the fifth step of the process as shown in FIGS. 8A and 8B. It is to be noted that these dimensions are not limited to the illustrated example and, for example, to select the width of the resistive members 103 greater than the width of the conductive members 102 is desirable because unprintable area is reduced. Since the precision of these dimensions is equivalent to that of the conventional thin-film integrated circuits, an extremely high precision can be realized, and the fluctuations in the final resistance values can be greatly improved from about ±30% in the prior art to ±10% or less.

In addition, the resistive members according to the present invention have a cross-section configuration near to a rectangle, resulting in a uniform heat-generating pattern and a raised thermal efficiency, and further, a subsidiary advantage is obtained such that the distance between the adjacent resistive members can be reduced, thereby attaining extremely high quality that is compatible to the thin film resistor type of thermal printing heads in the prior art.

In the above-described embodiments, although a photo-etching step as used in the thin-film integrated circuit technique is added upon formation of the thick-film conductive members, the cost of the equipment and labor needed for such photo-etching process is very small in comparison to the cost of the equipment and labor necessitated for manufacture of thin-film resistor type thermal printing heads, and therefore, thick-film resistor type thermal printing heads which are excellent in cost-performance, can be obtained. Depending upon the requirement for precision, however, the use of photo-resist 201 in the first step of the process may be omitted. Even in such cases, obviously the advantage of the present invention brought about by the specific cross-section configuration of the heat-generating resistors would be preserved.

While only several resistive members are illustrated in the drawings, it is a matter of course that the feature of the present invention is applicable to a large-sized thermal printing head in which several hundreds or several thousands of such resistive members are used. Needless to say, the principle of the present invention is applicable to a thermal printing head in which resistive members are arrayed in a matrix form. Also, as is shown in the aforementioned U.S. Pat. No. 3,903,393, one side of the conductive members can be arranged as common conductive member.

In one modified embodiment of the present invention, in place of the fifth step as shown in FIGS. 8A and 8B, the following alternative steps can be employed. That is, the device formed in the fourth step as shown in FIGS. 7A and 7B is fired for 30 minutes in an electric furnace containing an oxidizing atmosphere at a temperature (normally 500°–600° C.) that is somewhat lower than a softening point of the binder glass contained in the thick-film resistive paste, and thereby the photo-resist pattern 202 is burnt away to leave the portion of the photo-resist pattern as a hollow space. Since the resistive layer 203 is in a sintered state as held at a temperature lower than its softening temperature, it maintains its original shape. The device prepared through the above-described alternative step is immersed in a running-water supersonic cleaning bath for about 10 seconds. Then the portions of the resistive layer 203 located on the hollow portions left after the removal of the photo-resist pattern 202 are removed by supersonic forces, because these portions of the resistive layer 203 are in a weak sintered state. Thereafter, the remaining descrete resistive portions are fired at a predetermined high temperature (about 800° C.) in an electric furnace containing an oxidizing atmosphere.

The supersonic forces contribute to provide protuberance at the edge portion of the descrete resistive portions prior to the high-temperature firing. The initial protuberance would somewhat sag after the high-temperature firing, and so, the cross-sectional configuration eventually takes the shape as shown in FIG. 9B. Therefore, the cross-section configuration of the heat-generating resistor prepared according to the above-described modification has a shape desirable for heat-generating resistors in a thermal printing head because of the reasons described previously.

On the other hand, similar cross-sectional configurations may be made such that resistors having a semicircular cross-section are formed through the same process as the process for manufacturing a thick-film resistor type thermal printing head in the prior art, and a different screen printing plate is replaced and registered so that printing may be effected only at the opposite edge portions of the heat-generating resistors, and after leveling and drying operations the heat-generating resistors are fired at a predetermined high temperature. However, with respect to the precision in fluctuation of the resistance values, the last-mentioned method is obviously inferior to the method employing photo-resist pattern for resistive members. As described in detail above, the present invention provides a novel configuration of resistive members having such transversal cross-section that the edge portions are raised with respect to the center porition, thereby attaining high quality recording due to the evenness of temperature distribution. Furthermore, since the novel thermal printing head can be operated with lower electrical power than the thermal printing head in the prior art, a thermal printing head having a long life and a high reliability can be realized.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. A thermal printing head comprising: an insulative substrate, a pair of first and second conductive layers disposed on said substrate and having inner ends spaced from each other, and a resistive layer disposed on said substrate, extending between said first and second conductive layers, and electrically connected with said inner ends of said conductive layer so as to provide an electrical current path between said inner ends of said conductive layers, said resistive layer having a central portion extending along said electrical current path which is thinner than the edge portions of said resistive layer extending along said electrical current path so that the surface of said resistive layer is concave in a direction substantially perpendicular to said electrical current path whereby electrical current passing through said resistive layer produces a temperature rise over a wide area of the top surface of said resistive layer to transfer heat to a thermally sensitive recording medium in contact with said resistive layer.

2. The thermal printing head of claim 1, wherein the width of said resistive layer is less than the distance between said inner ends of the first and second conductive layers and the side portions of said resistive layer have a lower resistance value than that of said thinner central portion.

3. The thermal printing head of claim 1 or 2, wherein said first and second conductive layers are aligned in a straight line opposite each other and said inner end portions of said first and second conductive layers are covered with the end portions of said resistive layer.

4. The thermal printing head of claim 1 or 2 in which said insulative substrate is a black dielectric having a low reflective index.

5. A thermal printing head of claim 1 or 2 further comprising an anti abrasion layer disposed on said resistive layer and at least a portion of said first and second conductive layers.

* * * * *